(12) United States Patent
Mizuno et al.

(10) Patent No.: US 7,947,908 B2
(45) Date of Patent: May 24, 2011

(54) ELECTRONIC DEVICE

(75) Inventors: Shoichi Mizuno, Tokyo (JP); Hiroaki Takeuchi, Tokyo (JP); Shuji Nojima, Tokyo (JP)

(73) Assignee: Advantest Corporation, Tokyo (JP)

( * ) Notice: Subject to any disclaimer, the term of this patent is extended or adjusted under 35 U.S.C. 154(b) by 886 days.

(21) Appl. No.: 11/874,930

(22) Filed: Oct. 19, 2007

(65) Prior Publication Data
US 2009/0101396 A1    Apr. 23, 2009

(51) Int. Cl.
*H05K 1/16* (2006.01)

(52) U.S. Cl. ........ 174/260; 174/259; 361/776; 361/777; 361/795

(58) Field of Classification Search .......... 174/259–260; 361/763–766, 772–777, 794–795; 257/691–692
See application file for complete search history.

(56) References Cited

U.S. PATENT DOCUMENTS 6,221,694 B1 * 4/2001 Bhatt et al. ............... 438/122
6,534,901 B1 * 3/2003 Tsuzuki et al. ............ 310/348
6,885,563 B2 * 4/2005 Panella et al. ............. 361/794

FOREIGN PATENT DOCUMENTS

| JP | 03-211842 | 9/1991 |
|----|-----------|--------|
| JP | 06-303010 | 10/1994 |
| JP | 07-078902 | 3/1995 |
| JP | 07-086328 | 3/1995 |
| JP | 08-116202 | 5/1996 |
| JP | 09-120974 | 5/1997 |
| JP | 2007-88058 | 4/2007 |

* cited by examiner

*Primary Examiner* — Tuan T Dinh
(74) *Attorney, Agent, or Firm* — Jianq Chyun IP Office

(57) ABSTRACT

An electronic device is provided. The electronic device includes: a circuit board having a surface on which a hollow is formed; an electronic component placed into the hollow; a pattern wiring which is formed on a bottom surface of the hollow and whose tip is provided at a position corresponding to a signal electrode of the electronic component; a signal wire connecting a tip of the pattern wiring and the signal electrode of the electronic component; two in-hollow ground patterns formed so as to sandwich the tip of the pattern wiring therebetween on the bottom surface of the hollow; and two or more ground wires that connect two ground electrodes provided on the electronic component so as to sandwich the signal electrode therebetween to the corresponding in-hollow ground patterns, respectively.

10 Claims, 7 Drawing Sheets

C-C'

ELECTRONIC DEVICE

BACKGROUND

1. Technical Field

The present invention relates to an electronic device. Particularly, the present invention relates to an electronic device including a circuit board which includes a plurality of dielectric layers and has a surface having a hollow into which an electronic component is placed.

2. Related Art

As a multilayer substrate in which a plurality of substrates each of which has a pattern wiring are stacked, a multilayer substrate has been known as disclosed, for example, in Japanese Patent Application Publication No. 2007-88058. In such multilayer substrate, sometimes an electronic component is disposed in a concave portion which is formed by removing a dielectric layer as the surface of the multilayer substrate by means of machining. In this case, the electronic component disposed in the concave portion is electrically connected to a pattern wiring formed on a side surface of the concave portion through a wire, for example.

In such multilayer substrate, radio emission is generated from the wire connecting the electronic component to the pattern wiring when a high frequency signal is transmitted from the pattern wiring to the electronic component. Such radio emission sometimes has an effect on a signal transmitted through the other wire or the pattern wiring. Particularly, when an attenuator is disposed as the electronic component, it is expected that the attenuation ratio of input/output of the attenuator is affected.

SUMMARY

Therefore, it is an object of an aspect of the innovations herein to provide an electronic device, which is capable of overcoming the above drawbacks accompanying the related art. The above and other objects can be achieved by combinations described in the independent claims. The dependent claims define further advantageous and exemplary combinations of the present invention.

According to a first aspect related to the innovations herein, one exemplary electronic device is provided. The electronic device includes: a circuit board having a surface on which a hollow is formed; an electronic component placed within the hollow; a pattern wiring which is formed on a bottom surface of the hollow and whose tip is provided on a position corresponding to a signal electrode of the electronic component; a signal wire connecting the tip of the pattern wiring and the signal electrode of the electronic component; two in-hollow ground patterns which are formed so as to sandwich the tip of the pattern wiring therebetween on the bottom surface of the hollow; and two or more ground wires that connect two ground electrodes which are provided on the electronic component so as to sandwich the signal electrode therebetween to the corresponding in-hollow ground patterns, respectively.

The summary clause does not necessarily describe all necessary features of the embodiments of the present invention. The present invention may also be a sub-combination of the features described above.

The above and other features and advantages of the present invention will become more apparent from the following description of the embodiments taken in conjunction with the accompanying drawings.

DESCRIPTION OF EXEMPLARY EMBODIMENTS

Some aspects of the invention will now be described based on preferred embodiments, which do not intend to limit the scope of the invention, but exemplify the invention. All of the features and the combinations thereof described in the embodiments are not necessarily essential to the invention.

Figure 1:
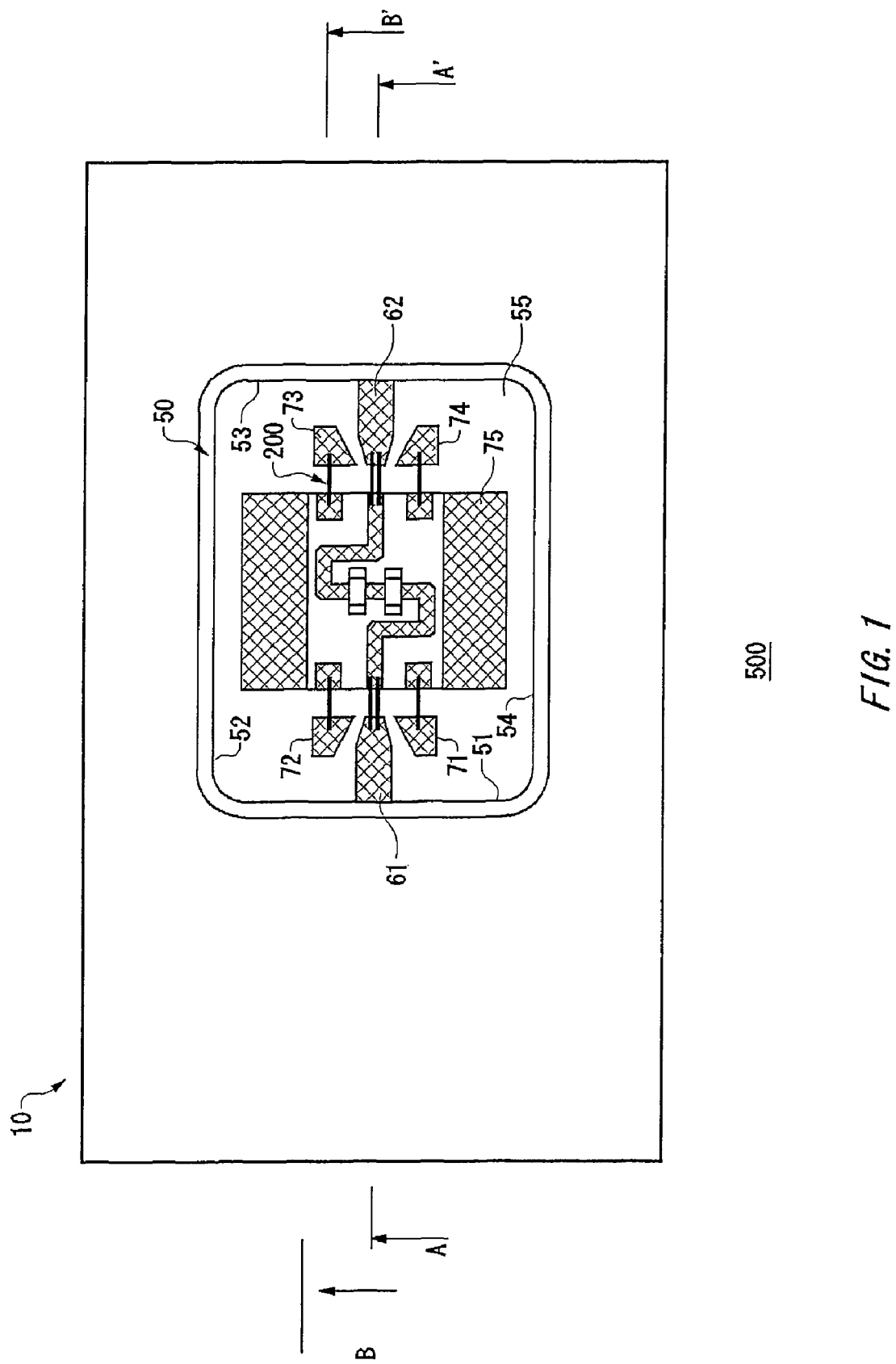
FIG. 1 is a top plan view showing an electronic device 500 according to the present embodiment.

FIG. 1 is a top plan view showing an electronic device 500 according to the present embodiment. The electronic device 500 is such as a SiP (System in Package) module that transmits/receives high frequency signals to/from a motherboard (not shown in figures) and includes a circuit board 10. A hollow 50 framed in by side surfaces 51-54 and a bottom surface 55 is formed on the surface of the circuit board 10. An electronic component 200 is placed into the hollow 50. Here, in FIG. 1 and the following other figures, only the peripheral part of the hollow 50 of the circuit board 10 is extracted and shown for ease of explanation, however, a plurality of hollows into which the other electronic components is placed may be formed on the circuit board 10 in addition to the hollow 50 into which the electronic component 200 is placed. Moreover, such as wiring and electronic components may be placed on the surface of the circuit board 10. Furthermore, the circuit board 10 may be a motherboard in itself that transmits/receives signals to/from the other circuit board.

Pattern wirings 61 and 62 and in-hollow ground patterns 71 to 75 are formed on a bottom surface 55 of the hollow 50. Among them, the in-hollow ground pattern 75 is formed between the electronic component 200 and the bottom surface 55 of the hollow 50. Here, all of the in-hollow ground patterns 71 to 75 are connected to ground and kept at the ground potential as described later. Here, the in-hollow ground pattern 75 may not always be formed dependent on the kind of the electronic component 200.

Figure 2:
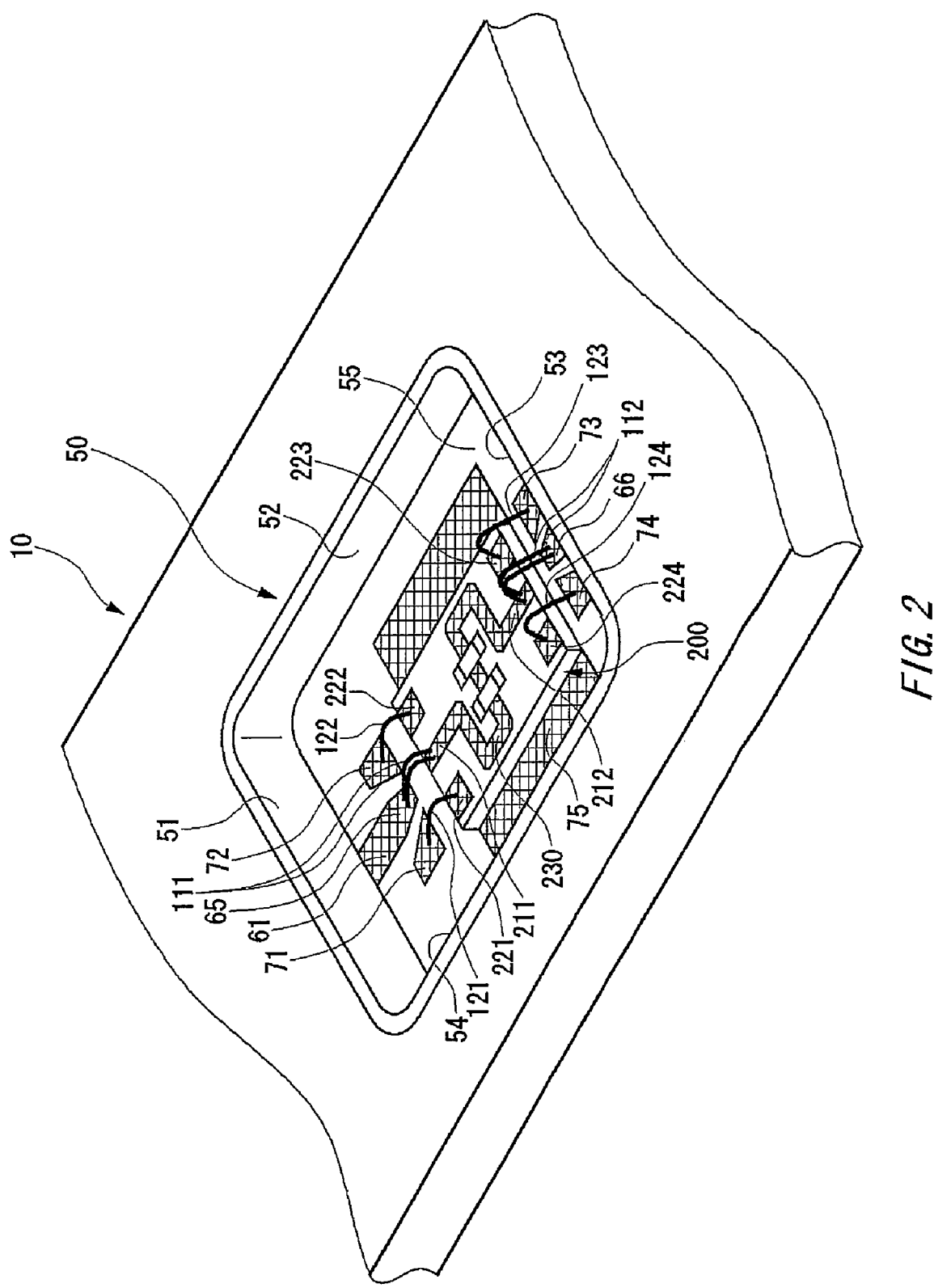
FIG. 2 is a perspective view by enlarging the neighborhood of a hollow 50 of a circuit board 10.

FIG. 2 is a perspective view by enlarging the neighborhood of the hollow 50 of the circuit board 10. As shown in FIG. 2, signal electrodes 211 and 212, a signal wiring 230, ground electrodes 221 to 224 are formed on the upper surface of the electronic component 200. The signal electrodes 211 and 212 are formed on a side surface 51 and a side surface 53 of the upper surface of the electronic component 200, respectively and electrically connected to each other through the signal wiring 230. Ground electrodes 221 and 222 are formed on both sides of the signal electrode 211 on the side surface 51 on the upper surface of the electronic component 200, meanwhile, ground electrodes 223 and 224 are formed on both sides of the signal electrode 212 on the side surface 53 on the upper surface. Here, the electronic component 200 may be an attenuator that attenuates signals inputted to the signal electrode 211 at a constant attenuation factor and outputs them from the signal electrode 212, and may be such as an IC and an LSI, for example.

The pattern wiring 61 is provided such that its tip 65 faces the signal electrode 211 near the signal electrode 211 of the electronic component 200. In addition, the tip 65 of the pattern wiring 61 is electrically connected to the signal electrode 211 of the electronic component 200 through a signal wire 111. Meanwhile, the pattern wiring 62 (see FIG. 1) is provided such that its tip 66 faces the signal electrode 212 near the signal electrode 212 of the electronic component 200. In addition, the tip 66 of the pattern wiring 62 is electrically connected to the signal electrode 212 of the electronic component 200 through a signal wire 112. Here, the signal wires 111 and 112 may be wires (air wiring) which are formed by wire bonding, for example. In addition, two signal wires 111 and two signal wires 112 are provided, respectively in the present embodiment, however, there may be one, or three or more signal wires 111 and 112, respectively.

The in-hollow ground patterns 71 and 72 are formed such that the tip 65 of the pattern wiring 61 is sandwiched by the in-hollow ground patterns 71 and 72 on the bottom surface 55 of the hollow 50. Accordingly, the tip 65 of the pattern wiring 61 and the in-hollow ground patterns 71 and 72 constitute a so-called coplanar line. Among the in-hollow ground patterns 71 and 72, the in-hollow ground pattern 71 faces the ground electrode 221 near the ground electrode 221 of the electronic component 200 and the in-hollow ground pattern 72 faces the ground electrode 222 near the ground electrode 222 of the electronic component 200. Meanwhile, the in-hollow ground patterns 73 and 74 are formed such that the tip 66 of the pattern wiring 62 is sandwiched by the in-hollow ground pattern 73 and 74 on the bottom surface 55 of the hollow 50. Accordingly, the tip 66 of the pattern wiring 62 and the in-hollow ground patterns 73 and 74 constitute the so-called coplanar line. Among the in-hollow ground patterns 73 and 74, the in-hollow ground pattern 73 faces the ground electrode 223 near the ground electrode 223 of the electronic component 200, and the in-hollow ground pattern 74 faces the ground electrode 224 near the ground electrode 224 of the electronic component 200.

The in-hollow ground pattern 71 is electrically connected to the ground electrode 221 of the electronic component 200 through the ground wire 121. In the same way, the in-hollow ground patterns 72 to 74 are electrically connected to the ground electrodes 222 to 224 of the electronic component 200 through the ground wires 122 to 124, respectively. Thereby the ground wires 121 and 122 are provided so as to sandwich the signal wire 111 therebetween, and the ground wires 123 and 124 are provided so as to sandwich the signal wire 112 therebetween. In addition, all of the ground wires 121 to 124, and the ground electrodes 221 to 224 which are electrically connected to the in-hollow ground patterns 71 to 74 through the ground wires 121 to 124 are kept at approximately the same potential as that of the in-hollow ground patterns 71 to 74, i.e. the ground potential.

By arranging the ground wires 121 to 124 as described above, the ground wires 121 to 124 are provided so as to run parallel to one another on both sides of each of the signal wires 111 and 112 as air wiring. Thereby signals transmitted on the electronic component 200, the signal wire 112 and the pattern wirings 61 and 62 can be prevented from being affected by radio emission from the signal wire 111. In addition, signals transmitted on the electronic component 200, the signal wire 111 and the pattern wirings 61 and 62 can be prevented from being affected by radio emission from the signal wire 112. Here, the ground wires 121 to 124 may be wires (air wiring) which are formed by wire bonding. There is each one of ground wires 121 to 124 in the present embodiment, however, there may be two or more ground wires 121 to 124, respectively.

Continuously it will be described that the characteristic of the tip 65 of the pattern wiring 61 on the circuit board 10 and the in-hollow ground patterns 71 and 72 provided so as to sandwich the tip 65 therebetween. Here, the above-described characteristic is common to the characteristic of the tip 66 of the pattern wiring 62 and that of the in-hollow ground patterns 73 and 74 provided so as to sandwich the tip 66 therebetween, so that the descriptions of the characteristics of the tip 66 and the in-hollow ground patterns 73 and 74 are omitted.

The tip 65 of the pattern wiring 61 is formed such that its pattern width is gradually increased in accordance with a distance from the end of the electronic component 200. That is, the tip 65 of the pattern wiring 61 is formed such that the width in the direction in parallel with the side surface 51 is gradually increased from the side proximate to the electronic component 200 to the side close to the side surface 51 of the hollow 50. Thereby variation in impedance of a junction between the tip 65 and the signal wire 111 can be reduced in comparison with a case that the above-described width of the tip 65 of the pattern wiring 61 is fixed.

The in-hollow ground patterns 71 and 72 provided so as to sandwich the tip 65 of the pattern wiring 61 therebetween are formed so as to be gradually reduced their pattern widths in accordance with a distance from the electronic component 200. That is, the in-hollow ground pattern 71 is formed such that the width in the direction in parallel with the side surface 51 is gradually reduced from the side proximate to the electronic component 200 to the side close to the side surface 51 of the hollow 50, for example. In addition, the in-hollow ground patterns 71 and 72 are formed such that a distance between the tip 65 of the pattern wiring 61 and the in-hollow ground pattern 71, and a distance between the tip 65 and the in-hollow ground pattern 72 are gradually increased in accordance with a distance from the end of the electronic component 200. That is, the distance between the tip 65 of the pattern wiring 61 and the in-hollow ground pattern 71 in the direction in parallel with the side surface 51 is formed so as to be gradually increased from the side proximate to the electronic component 200 to the side close to the side surface 51 of the hollow 50, for example. Thereby variation in impedance of the tip 65 of the pattern wiring 61 is reduced.

Figure 3:
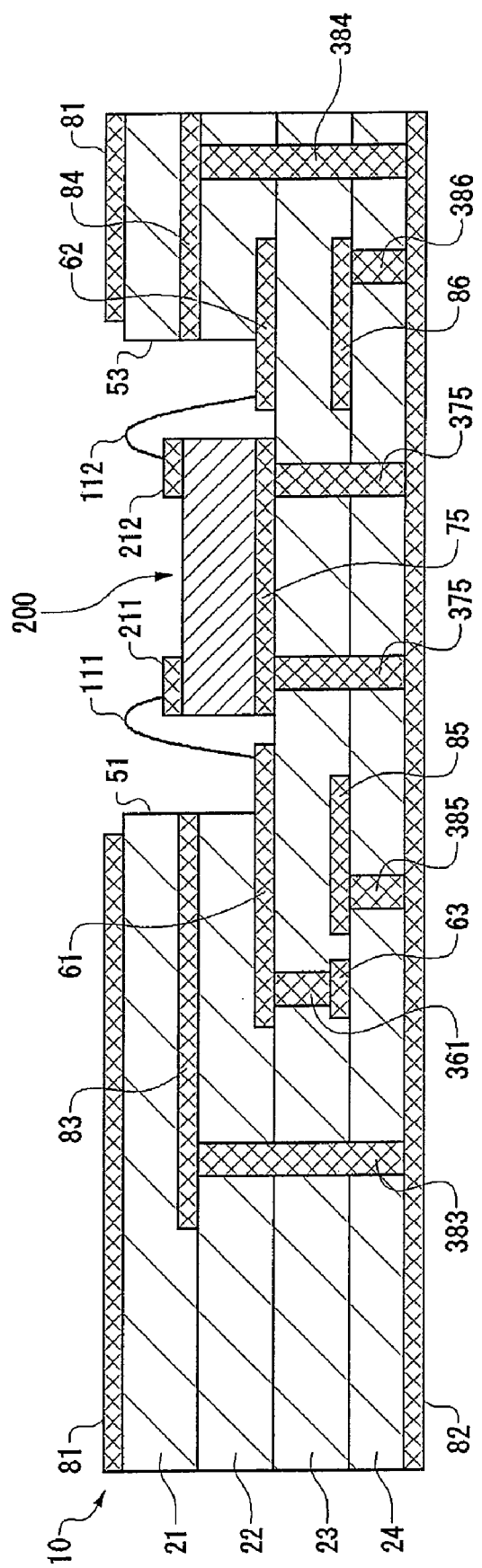
FIG. 3 is a cross-sectional view showing a cross section by A-A' line as shown in FIG. 1 viewed from a direction of an arrow of the cross section.
Figure 4:
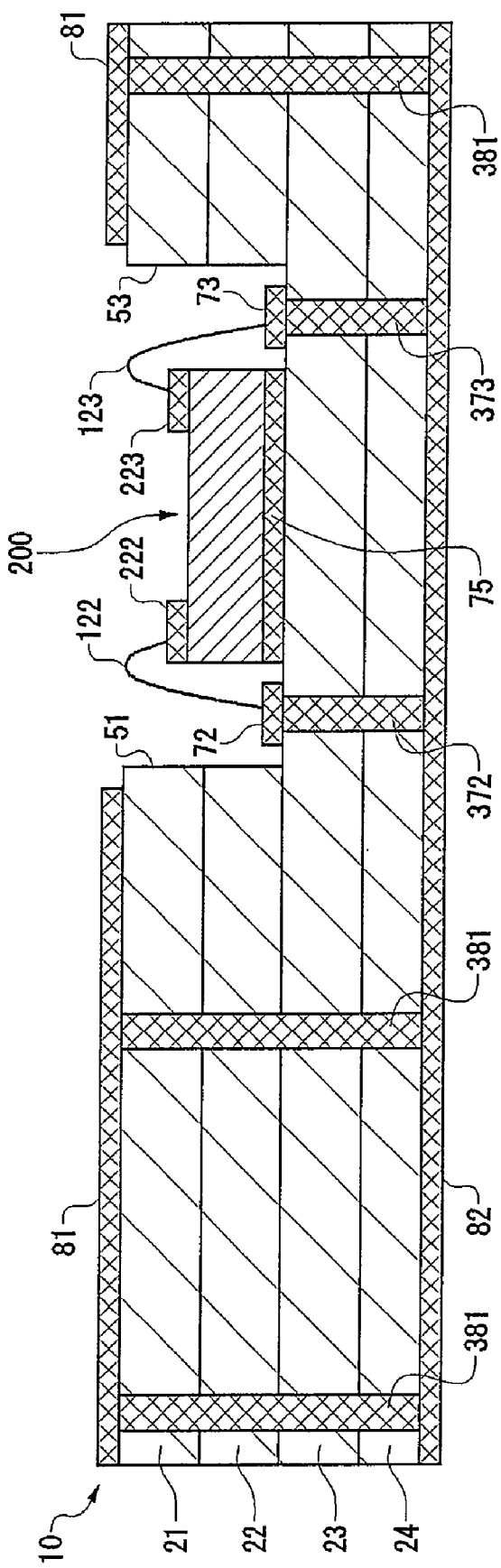
FIG. 4 is a cross-sectional view showing a cross section by B-B' line as shown in FIG. 1 viewed from a direction of an arrow of the cross section.

FIG. 3 is a cross-sectional view showing a cross section by A-A' line as shown in FIG. 1 viewed from a direction of an arrow of the cross section. In addition, FIG. 4 is a cross-sectional view showing a cross section by B-B' line as shown in FIG. 1 viewed from a direction of an arrow of the cross section. As shown in FIG. 3 and FIG. 4, the circuit board 10 is a multilayer substrate and has a plurality of dielectric layers 21 to 24. Here, each upper (lower) side surface of the dielectric layers 21 to 24 as shown in FIG. 3 and FIG. 4 in the following description is referred to as "the upper surface (lower surface) of each of the dielectric layers 21 to 24". Moreover, particularly, the upper side surface of the dielectric layer 21 is referred to as "the upper surface of the circuit board 10" and the lower side surface of the dielectric layer 24 is referred to as "the lower surface of the circuit board 10".

As shown in FIG. 3 and FIG. 4, a surface-side ground pattern 81 is provided on the upper surface of the circuit board 10 and a bottom surface-side ground pattern 82 is provided on the lower surface of the circuit board 10. A bottom surface-side ground pattern 82 is connected to ground outside the circuit board via such as an electric wiring or an electrode ball (not shown in the figure) and kept at the ground potential.

Meanwhile, the surface-side ground pattern 81 is electrically connected to the bottom surface-side ground pattern 82 via a plurality of interlayer wires 381 formed through the dielectric layers 21 to 24. Therefore, the surface-side ground pattern 81 is kept at a potential substantially the same as that of the bottom surface-side ground pattern 82, i.e. substantially the ground potential.

The hollow 50 is formed on a portion obtained by eliminating a part of the dielectric layers 21 and 22 among the plurality of dielectric layers 21 to 24 of the circuit board 10. Accordingly, each of the side surfaces 51 to 54 of the hollow 50 is a cross section of the dielectric layers 21 and 22. Meanwhile, the bottom surface 55 of the hollow 50 is a part of the upper surface of the dielectric layer 23 which is exposed by eliminating a part of the dielectric layers 21 and 22. In addition, as shown in FIG. 3, the in-hollow ground pattern 75 formed between the electronic component 200 and the bottom surface 55 of the hollow 50 is electrically connected to the bottom surface-side ground pattern 82 through a plurality of interlayer wires 375 formed through the dielectric layers 23 and 24. Moreover, as shown in FIG. 4, the in-hollow ground patterns 72 and 73 are electrically connected to the bottom surface-side ground pattern 82 via interlayer wires 372 and 373 formed through the dielectric layers 23 and 24, respectively. Here, the in-hollow ground patterns 71 and 74 are also electrically connected to the bottom surface-side ground pattern 82 via an interlayer wire (the figure is omitted) formed through the dielectric layers 23 and 24 as well as the in-hollow ground patterns 72 and 73. As described above, the in-hollow ground patterns 71 to 75 can be kept at the potential substantially the same as that of the bottom surface-side ground pattern 82, i.e. substantially the ground potential.

The pattern wirings 61 and 62 are formed by intersecting the side surfaces 51 and 53, respectively i.e. beyond the side surfaces 51 and 53, and extending from the bottom surface 55 of the hollow 50 to a space between the dielectric layers 22 and 23. The pattern wiring 61 may be further electrically connected to the pattern wiring 63 formed on the upper surface of the dielectric layer 24 via the interlayer wire 361 formed through the dielectric layer 23, between the dielectric layers 22 and 23. Meanwhile, the pattern wiring 62 may be electrically connected to the other pattern wiring (not shown in the figure) formed on the upper surface of the dielectric layer 23 outside the hollow 50. Here, a connection configuration of the pattern wirings 61 and 62 outside the hollow 50 is not limited to the configuration of the present embodiment. The pattern wirings 61 and 62 may be electrically connected to such as a pattern wiring formed on a dielectric layer different from that of the present embodiment in accordance with the kind or a destination (source) of a signal transmitted.

An upper layer-side ground pattern 83 is provided so as to face the pattern wiring 61 on the upper surface of the dielectric layer 22 above the dielectric layer 23 having the upper surface on which the pattern wiring 61 is formed. In addition, a lower layer-side ground pattern 85 is provided so as to face the pattern wiring 61 on the upper surface of the dielectric layer 24 below the dielectric layer 23. The upper layer-side ground pattern 83 and the lower layer-side ground pattern 85 are electrically connected to the bottom surface-side ground pattern 82 via the interlayer wire 383 formed through the dielectric layers 22 to 24 and the interlayer wire 385 formed through the dielectric layer 24, respectively. Therefore, the upper layer-side ground pattern 83 and the lower layer-side ground pattern 85 are kept at a potential substantially the same as that of the bottom surface-side ground pattern 82, i.e. substantially the ground potential.

Therefore, the pattern wiring 61 forms a stripline with the upper layer-side ground pattern 83 and the lower layer-side ground pattern 85 on a portion other than the portion formed on the bottom surface 55 of the hollow 50. In addition, the lower layer-side ground pattern 85 is also formed on the under side of the portion formed on the bottom surface 55 of the hollow 50 of the pattern wiring 61. Accordingly, the pattern wiring 61 forms a microstripline with the lower layer-side ground pattern 85 on a portion formed on the bottom surface 55 of the hollow 50.

Meanwhile, the upper layer-side ground pattern 84 is provided so as to face the pattern wiring 62 on the upper surface of the dielectric layer 22 above the dielectric layer 23 having the upper surface on which the pattern wiring 62 is formed. The lower layer-side ground pattern 86 is provided so as to face the pattern wiring 62 on the upper surface of the dielectric layer 24 below the dielectric layer 23. An upper layer-side ground pattern 84 and the lower layer-side ground pattern 86 are electrically connected to the bottom surface-side ground pattern 82 via the interlayer wire 384 formed through the dielectric layers 22 to 24 and the interlayer wire 386 formed through the dielectric layer 24 and kept at substantially the ground potential, respectively.

Therefore, the pattern wiring 62 forms a stripline with the upper layer-side ground pattern 84 and the lower layer-side ground pattern 86 on a portion other than the portion formed on the bottom surface 55 of the hollow 50. Meanwhile, the lower layer-side ground pattern 86 is also formed on the under side of the portion formed on the bottom surface 55 of the hollow 50 of the pattern wiring 62. Therefore, the pattern wiring 62 forms a microstripline with the lower layer-side ground pattern 86 on the portion formed on the bottom surface 55 of the hollow 50.

Figure 5:
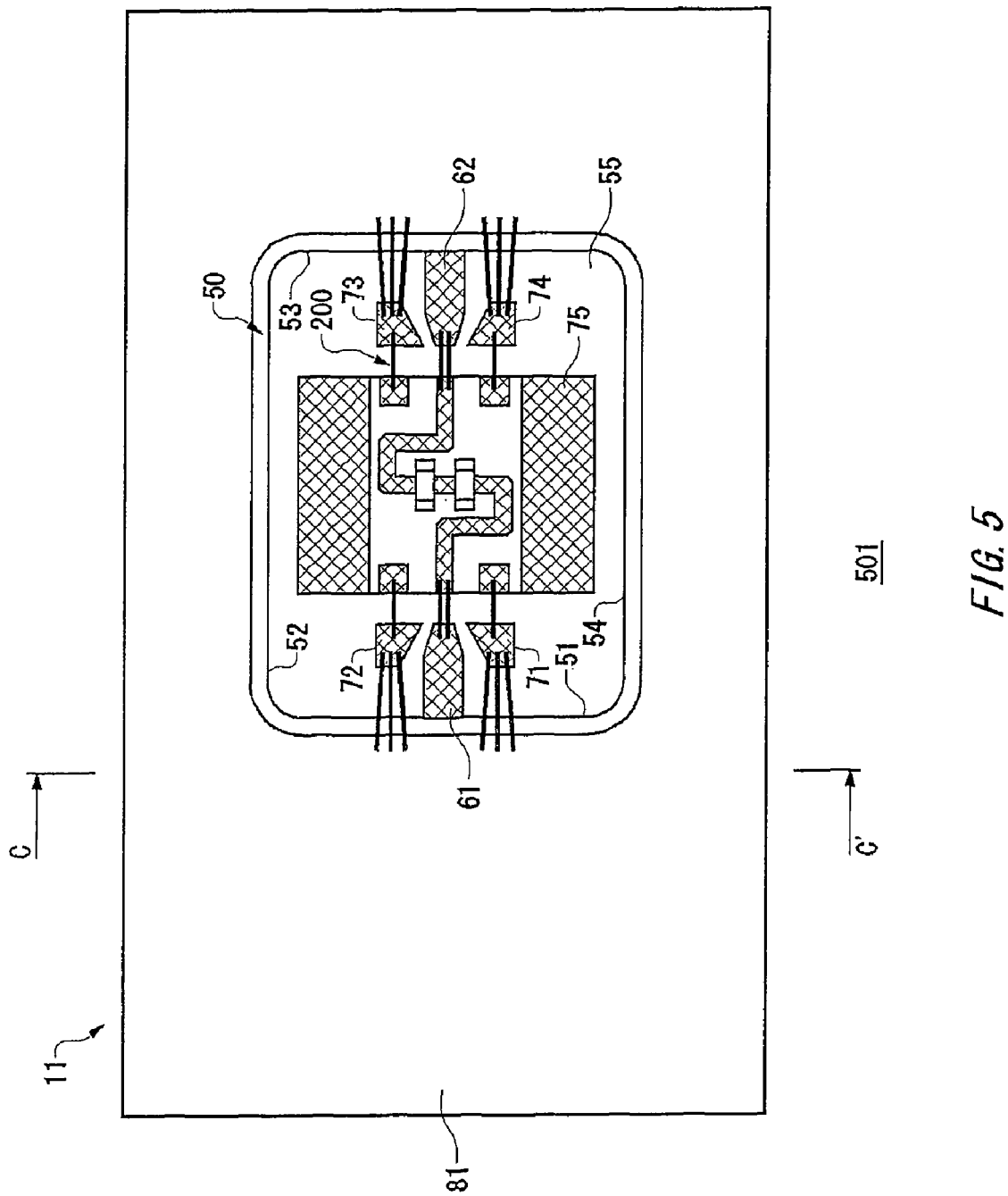
FIG. 5 is a top plan view showing an electronic device 501 according to another example of the embodiment.

FIG. 5 is a top plan view showing an electronic device 501 according to another example of the present embodiment. Components of the electronic device 501 the same as those of the electronic device 500 described with reference to FIG. 1 to FIG. 4 have reference numerals the same as those of FIG. 1 to FIG. 4, so that the description is partially omitted. The electronic device 501 includes a circuit board 11 having a plurality of dielectric layers 21 to 24 as well as the above-described circuit board 10.

A hollow 50 is formed on the surface of the circuit board 11, and an electronic component 200 is placed into the hollow 50. In addition, pattern wirings 61 and 62 and in-hollow ground patterns 71 to 75 are formed on a bottom surface 55 of the hollow 50.

Figure 6:
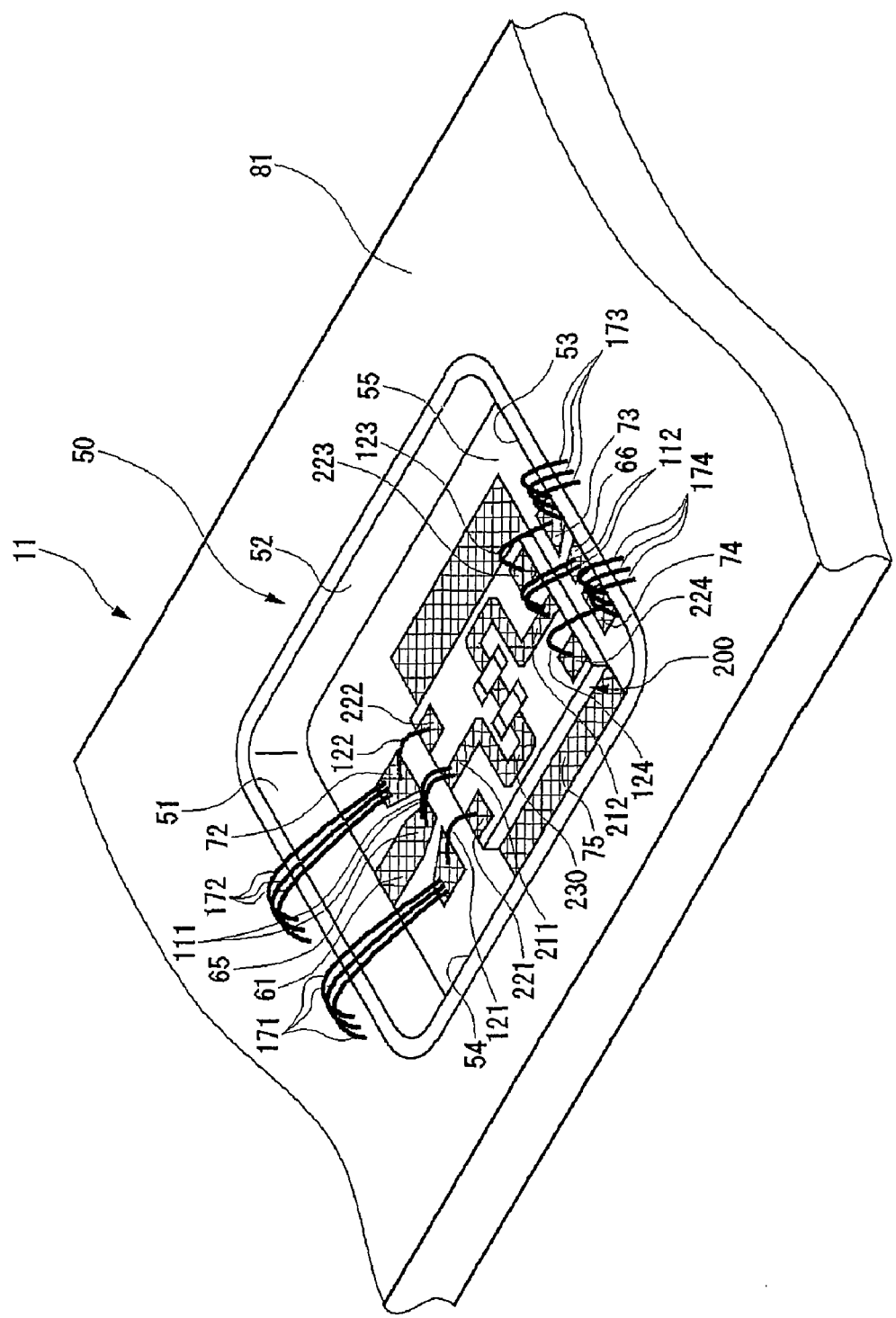
FIG. 6 is a perspective view by enlarging the neighborhood of a hollow 50 of a circuit board 11.

FIG. 6 is a perspective view by enlarging the neighborhood of the hollow 50 of the circuit board 11. As shown in FIG. 6, the in-hollow ground pattern 71 is electrically connected to a surface-side ground pattern 81 provided on the upper surface of the circuit board 11 via a shield wire 171. In the same way, the in-hollow ground patterns 72 to 74 are electrically connected to the surface-side ground pattern 81 via shield wires 172 to 174, respectively. The shield wires 171 and 172 are air-wired above the pattern wiring 61 including an upper space of the side surface 51 intersecting the pattern wiring 61 extending from the outside to the inside of the hollow 50. In the same way, the shield wires 173 and 174 are air-wired above the pattern wiring 62 including an upper space of the side surface 53 intersecting the pattern wiring 62. All of those shield wires 171 to 174 are kept at a potential substantially the same as that of the in-hollow ground patterns 71 to 74 and the surface-side ground pattern 81, i.e. the ground potential.

By arranging the shield wires 171 to 174 described above, even if radio emission is generated from portions of the pattern wirings 61 and 62 which intersect the side surfaces 51 and 53 in the hollow 50, respectively and a portion more inside than the intersecting portion of the hollow 50, the effect created by the radio emission on signals transmitted on the electronic component 200, the signal wires 111 and 112 and the pattern wirings 61 and 62 can be reduced by the shield wires 171 to 174. Here, the shield wires 171 to 174 may be wires (air-wiring) formed by wire bonding. Moreover, it is preferred that a plurality of shield wires 171 to 174 are provided, respectively as the present embodiment, however, it is no problem if one or more shield wires 171 to 174 are provided.

Figure 7:
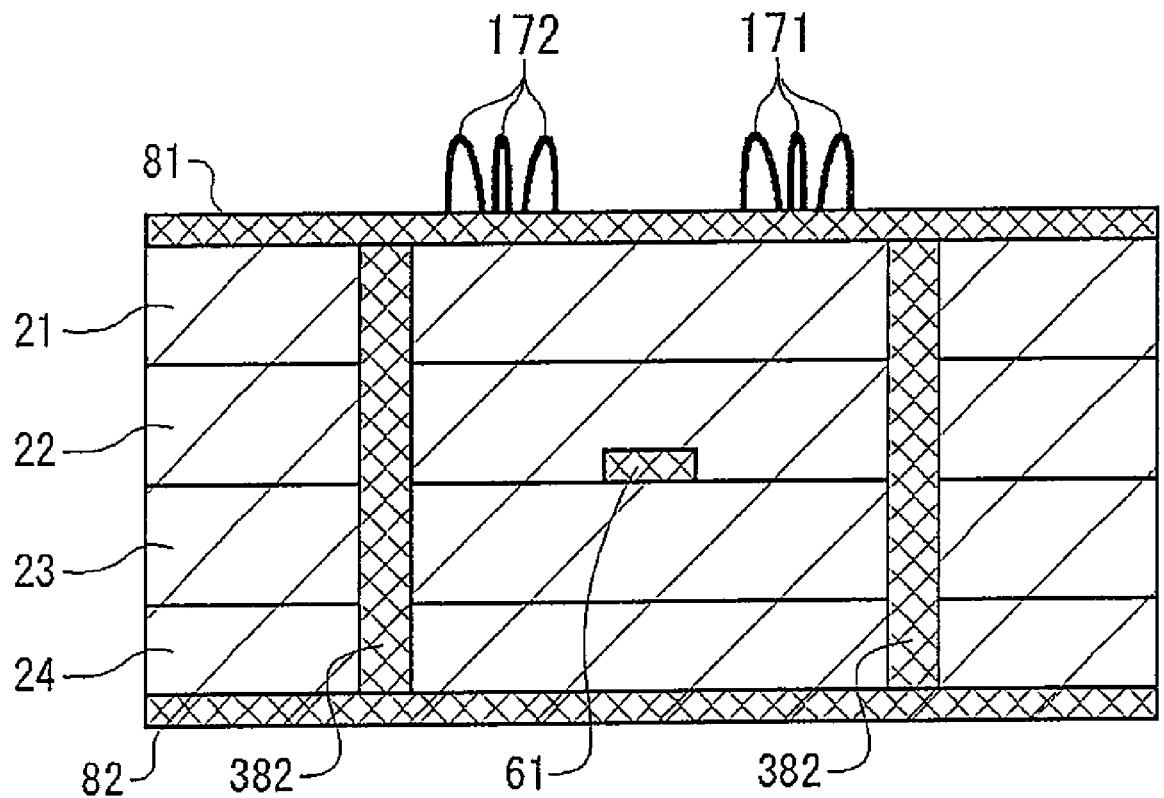
FIG. 7 is a cross-sectional view showing a cross section by C-C' line as shown in FIG. 5 viewed from a direction of an arrow of the cross section.

FIG. 7 is a cross-sectional view showing a cross section by C-C' line as shown in FIG. 5 viewed from a direction of an arrow of the cross section. As shown in FIG. 7, a plurality of interlayer wires 382 are formed on both sides of the pattern wiring 61 near the side surface 51 intersecting the pattern wiring 61 outside the hollow 50 (here, two interlayer wires 382 each of which is formed on one side of the pattern wiring 61 is formed in the present embodiment). Those interlayer wires 382 are formed through the dielectric layers 21 to 24 and electrically connects the surface-side ground pattern 81 to the bottom surface-side ground pattern 82. Here, a plurality of interlayer wires 382 may provided on both sides of the pattern wiring 61 and spaced from one another in a direction in parallel with the pattern wiring 61.

In addition, a distance between a connecting position of the shield wires 171 and 172 to the surface-side ground pattern 81 and the pattern wiring 61 is less than a distance between the pattern wiring 61 and the interlayer wire 382 in a direction in parallel with the side surface 51 intersecting the pattern wiring 61, i.e. the horizontal direction of the cross-sectional view as shown in FIG. 7. Specifically, in the above-described direction, a distance between a connecting position of each one end of the shield wires 171 and 172 to the surface-side ground pattern 81 and the pattern wiring 61 is less than a distance between each of the interlayer wires 382 provided on both sides of the pattern wiring 61 and the pattern wiring 61.

By arranging the shield wires 171 and 172 described above, the shield wires 171 and 172 can be provided so as to run in parallel with each other on both sides of a portion intersecting the side surface 51 of the hollow 50 and a portion nearer the 200 on the bottom surface 55 of the hollow 50 than the intersecting portion on the pattern wiring 61. Thereby signals transmitted on the electronic component 200, the signal wires 111 and 112, and the pattern wirings 61 and 62 can be prevented from being affected by radio emission from the above described portions of the pattern wiring 61.

Here, although an illustration and a description are omitted, a plurality of interlayer wires may be formed on both sides of the pattern wiring 62 near the side surface 53 intersecting the pattern wiring 62 outside the hollow 50. In this case, it is preferred that a distance between connecting positions of the shield wires 173 and 174 to the surface-side ground pattern 81 and the pattern wiring 62 is less than a distance between the pattern wiring 62 and the plurality of interlayer wires in a direction in parallel with the side surface 53 intersecting the pattern wiring 62.

By arranging the shield wires 173 and 174 as described above, the shield wires 173 and 174 can be provided so as to run in parallel with each other on both sides of a portion intersecting the side surface 53 of the hollow 50 and a portion nearer the 200 on the bottom surface 55 of the hollow 50 than the intersecting portion on the pattern wiring 62. Thereby signals transmitted on the electronic component 200, the signal wires 111 and 112, and the pattern wirings 61 and 62 can be prevented from being affected by radio emission from the above described portions of the pattern wiring 62.

While the aspects of the invention have been described by way of the exemplary embodiments, it should be understood that those skilled in the art might make many changes and substitutions without departing from the spirit and scope of the invention. It is obvious from the definition of the appended claims that the embodiments with such modifications also belong to the scope of the invention.

As apparent from the above descriptions, according to an embodiment of the present invention, it is possible to provide an electronic device provided with a circuit board which includes a plurality of dielectric layers and has a surface having a hollow into which an electronic component is placed.

What is claimed is:

1. An electronic device comprising:
   a circuit board having a surface on which a hollow is formed;
   an electronic component placed into the hollow;
   a pattern wiring which is formed on a bottom surface of the hollow and whose tip is provided at a position corresponding to a signal electrode of the electronic component;
   a signal wire connecting a tip of the pattern wiring and the signal electrode of the electronic component;
   two in-hollow ground patterns formed so as to sandwich the tip of the pattern wiring therebetween on the bottom surface of the hollow; and
   two or more ground wires that connect two ground electrodes provided on the electronic component so as to sandwich the signal electrode therebetween to the corresponding in-hollow ground patterns, respectively.

2. The electronic device as set forth in claim 1, wherein the tip of the pattern wiring is formed such that a pattern width is gradually increased in accordance with a distance from an end of the electronic component.

3. The electronic device as set forth in claim 1, comprising two or more the signal wires.

4. The electronic device as set forth in claim 1, further comprising a shield wire that connects a surface-side ground pattern provided on an upper surface of the circuit board to the in-hollow ground pattern, wherein
   the pattern wiring is formed across an inner portion of the circuit board from the bottom surface of the hollow so as to intersect any side surface of the hollow, and
   the shield wire is air-wired in a area above the pattern wiring including an area above the side surface intersecting the pattern wiring.

5. The electronic device as set forth in claim 2, wherein the two in-hollow ground patterns are provided so as to sandwich the tip of the pattern wiring therebetween, each of the in-hollow ground patterns whose pattern width is gradually decreased in accordance with a distance from the electronic component.

6. The electronic device as set forth in claim 4, wherein
   the circuit board is a multilayer substrate having a plurality of dielectric layers, and
   the circuit board including:
   a lower layer-side ground pattern provided so as to face the pattern wiring in the dielectric layer below the dielectric layer including the bottom surface of the hollow; and
   an upper layer-side ground pattern provided so as to face the pattern wiring in the dielectric layer above the dielectric layer including the bottom surface of the hollow.

7. The electronic device as set forth in claim 5, wherein the in-hollow ground pattern and the tip of the pattern wiring are formed such that a distance between the in-hollow ground pattern and the tip of the pattern wiring is gradually increased in accordance with the distance from the electronic component.

8. The electronic device as set forth in claim 6, further comprising an interlayer wire formed through the dielectric layer on both sides of the pattern wiring and connecting the surface-side ground pattern to ground, wherein a distance between a connecting position of at least one of the shield wires to the surface-side ground pattern and the pattern wiring is less than a distance between the pattern wiring and the interlayer wire in a direction in parallel with the side surface intersecting the pattern wiring.

9. The electronic device as set forth in claim 6, further comprising an interlayer wire that connects the in-hollow ground pattern to ground.

10. The electronic device as set forth in claim 8, wherein the distance between the connecting positions of all the shield wires to the surface-side ground pattern and the pattern wiring is less than the distance between the pattern wiring and the interlayer wire.

* * * * *